United States Patent
Lee et al.

(10) Patent No.: US 12,114,442 B2
(45) Date of Patent: Oct. 8, 2024

(54) CUSHION PLATE AND DISPLAY DEVICE INCLUDING THE SAME

(71) Applicant: LG Display Co., Ltd., Seoul (KR)

(72) Inventors: Buhui Lee, Gumi-si (KR); Wangeon Sim, Paju-si (KR); Kyoung-Hoon Kim, Gumi-si (KR); Kwangju Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 17/824,788

(22) Filed: May 25, 2022

(65) Prior Publication Data

US 2022/0418128 A1 Dec. 29, 2022

(30) Foreign Application Priority Data

Jun. 24, 2021 (KR) .......................... 10-2021-0082518

(51) Int. Cl.
  *H05K 7/20* (2006.01)
  *H05K 5/00* (2006.01)
  *H05K 5/02* (2006.01)

(52) U.S. Cl.
  CPC .......... *H05K 5/0217* (2013.01); *H05K 5/0017* (2013.01); *H05K 7/20963* (2013.01)

(58) Field of Classification Search
  None
  See application file for complete search history.

(56) References Cited

U.S. PATENT DOCUMENTS

| | | | |
|---|---|---|---|
| 9,610,751 B2 | 4/2017 | Jung et al. | |
| 10,198,041 B2* | 2/2019 | Myeong | G02F 1/133305 |
| 10,383,239 B2* | 8/2019 | Lee | H05K 5/0017 |
| 10,755,991 B2 | 8/2020 | Park et al. | |
| 11,221,648 B2* | 1/2022 | Myeong | G06F 1/1681 |
| 11,455,005 B2* | 9/2022 | Seo | G06F 1/1637 |
| 2010/0238612 A1* | 9/2010 | Hsiao | H05K 1/189 |
| | | | 361/679.01 |
| 2015/0282336 A1 | 10/2015 | Jung et al. | |
| 2019/0385491 A1 | 12/2019 | Xu et al. | |
| 2020/0051881 A1 | 2/2020 | Park et al. | |
| 2020/0152895 A1* | 5/2020 | Zhu | H01L 25/18 |
| 2020/0264668 A1 | 8/2020 | Baek et al. | |
| 2021/0168929 A1 | 6/2021 | Wang et al. | |
| 2023/0055609 A1* | 2/2023 | Seo | H05K 5/0217 |

(Continued)

FOREIGN PATENT DOCUMENTS

| | | |
|---|---|---|
| CN | 110853520 A | 2/2020 |
| CN | 111627337 A | 9/2020 |

(Continued)

*Primary Examiner* — Xanthia C Relford
(74) *Attorney, Agent, or Firm* — Fenwick & West LLP (57) ABSTRACT

Disclosed are a cushion plate and a display device including the same. The cushion plate includes an impact-absorbing layer disposed on a back surface of a display panel, a first metal layer disposed on upper portion of the impact-absorbing layer, and a second metal layer formed on upper portion of the first metal layer and having a higher thermal conductivity than the first metal layer. The impact-absorbing layer, the first metal layer, and the second metal layer have a first curvature area, and at least one perforated pattern is defined in an area of the first metal layer corresponding to the first curvature area.

20 Claims, 5 Drawing Sheets

(56) References Cited

U.S. PATENT DOCUMENTS

| | | | |
|---|---|---|---|
| 2023/0255053 A1* | 8/2023 | Chen | H10K 59/8794 |
| | | | 361/708 |
| 2024/0032220 A1* | 1/2024 | Kim | G06F 1/1624 |
| 2024/0062685 A1* | 2/2024 | Cho | G06F 1/1656 |

FOREIGN PATENT DOCUMENTS

| | | | |
|---|---|---|---|
| CN | 112086491 A | 12/2020 |
| KR | 10-2020-0019000 A | 2/2020 |
| KR | 10-2020-0099632 A | 8/2020 |
| KR | 10-2202145 B1 | 1/2021 |

\* cited by examiner

CUSHION PLATE AND DISPLAY DEVICE INCLUDING THE SAME

CROSS-REFERENCE TO RELATED APPLICATION

This application claims priority from Korean Patent Application No. 10-2021-0082518 filed on Jun. 24, 2021 in the Korean Intellectual Property Office, and all the benefits accruing therefrom under 35 U.S.C. 119, the contents of which in its entirety are herein incorporated by reference.

BACKGROUND

Field

The present disclosure relates to a display device, and more specifically, to a cushion plate that can improve heat-dissipation performance of dissipating heat generated from a display panel and rigidity performance of protecting the display panel from external physical impact, and a display device including the same.

Description of Related Art

A display device that implements various information on a screen is a key technology in information and communication era, and is developing so as to have higher performance while being thinner, lighter, and more portable.

Such a display device is implemented in various forms such as a television, a monitor, a smart phone, a tablet PC, a laptop computer, and a wearable device.

Recently, the display device has been developed with a curved surface to increase immersion and tension of a viewer.

Heat is generated from a display panel during operation of the display device. When such heat is continuously concentrated, an element of the display panel is damaged or deformed, so that driving stability and a lifespan of the display device can be rapidly reduced.

In addition, the display panel can be vulnerable to external physical impact as the display panel has a form of a thin-film.

SUMMARY

A display device includes a cushion plate that is disposed on a back surface of a display panel. The cushion plate can dissipate heat generated from the display panel and protect the display panel from an external physical impact.

In a case of a display device including a curvature area with a radius of curvature equal to or smaller than a specific radius of curvature, a lifting or dent phenomenon can occur in the curvature area when the cushion plate is attached.

Such lifting or dent phenomenon of the cushion plate can prevent the heat generated from the display panel from being efficiently dissipated or can prevent the display panel from being protected from external physical impact.

The inventors of the present disclosure invented a cushion plate that can dissipate the heat generated from the display panel and protect the display panel even when the curvature area with the radius of curvature equal to or smaller than the specific radius of curvature is included.

The purpose of the present disclosure is to provide a cushion plate that can improve heat-dissipation performance of dissipating heat generated from a display panel and rigidity performance of protecting the display panel from external physical impact, and a display device including the same.

Further, the purpose of the present disclosure is to provide a cushion plate that can improve heat-dissipation and rigidity performances by preventing an occurrence of a lifting or dent phenomenon in a curvature area, and a display device including the same.

Purposes of the present disclosure are not limited to the above-mentioned purpose. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the embodiments and combinations thereof.

A cushion plate according to an embodiment includes an impact-absorbing layer disposed on a back surface of a display panel and a first metal layer disposed on the impact-absorbing layer, and a second metal layer formed on the first metal layer and having a higher thermal conductivity than the first metal layer. The impact-absorbing layer, the first metal layer, and the second metal layer have a first curvature area, and at least one perforated pattern is defined or disposed in an area of the first metal layer corresponding to the first curvature area.

A display device according to an embodiment includes a display panel, and a cushion plate disposed on a back surface of the display panel. The cushion plate includes an impact-absorbing layer disposed on the back surface of the display panel, a first metal layer disposed on the impact-absorbing layer, and a second metal layer formed on the first metal layer and having a higher thermal conductivity than the first metal layer. The impact-absorbing layer, the first metal layer, and the second metal layer have a first curvature area, and at least one perforated pattern is defined or disposed in an area of the first metal layer corresponding to the first curvature area.

A display device according to an embodiment includes a display panel including a first curvature area and a second curvature area, and a cushion plate disposed on a back surface of the display panel. The first curvature area has a radius of curvature equal to or smaller than a reference radius of curvature and the second curvature area has a radius of curvature greater than the reference radius of curvature. The cushion plate includes an impact-absorbing layer disposed on the back surface of the display panel, a first metal layer disposed on the impact-absorbing layer, and a second metal layer formed on the first metal layer and having a higher thermal conductivity than the first metal layer. The impact-absorbing layer, the first metal layer, and the second metal layer have a first curvature area, and at least one perforated pattern is defined or disposed in an area of the first metal layer corresponding to the first curvature area.

The cushion plate and the display device including the same according to an embodiment can improve the rigidity performance of protecting the display panel from the external physical impact because the first metal layer having the great strength is disposed on the impact-absorbing layer.

Further, the cushion plate and the display device including the same according to an embodiment can improve the heat-dissipation performance of dissipating the heat generated from the display panel because the second metal layer with the high thermal conductivity is disposed on the first metal layer.

Further, the cushion plate and the display device including the same according to an embodiment can prevent the lifting or dent phenomenon of the cushion plate in the first curvature area because the at least one perforated pattern is defined or disposed in the area of the first metal layer corresponding to the first curvature area.

Further, the cushion plate and the display device including the same according to an embodiment can improve the rigidity performance and the heat-dissipation performance because the lifting or dent phenomenon is prevented in the first curvature area.

Further, the cushion plate and the display device including the same according to an embodiment can provide the driving stability and slow the deterioration speed of the lifespan by improving the heat-dissipation performance.

Effects of the present disclosure are not limited to the above-mentioned effects, and other effects as not mentioned will be clearly understood by those skilled in the art from following descriptions.

DETAILED DESCRIPTIONS

Advantages and features of the present disclosure, and a method of achieving the advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

As used herein, the term "substantially," "about," and similar terms are used as terms of approximation, and are intended to account for inherent deviations in measured or calculated values that would be recognized by those of ordinary skill in the art. The term can be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a cushion plate that can improve a heat-dissipation performance of dissipating heat generated from a display panel and a rigidity performance of protecting the display panel from an external physical impact, and a display device including the same area disclosed.

Figure 1:
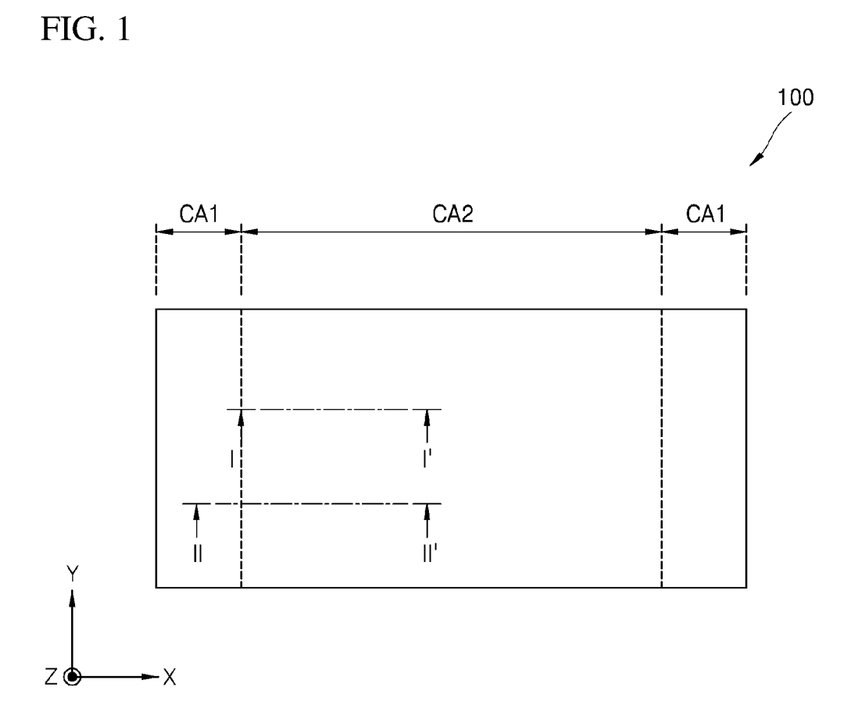
FIG. 1 is a diagram showing a display device according to an embodiment.

FIG. 1 is a diagram showing a display device 100 according to an embodiment.

A direction of a back surface and an upward direction defined in the present disclosure refer to a Z-axis direction, and a direction of a front face and a downward direction refer to a −Z-axis direction. In one example, FIG. 1 shows a back surface of the display device 100.

The display device 100 can include a display panel and a cushion plate. The display panel can include a display area to display an image on a front face thereof, and the cushion plate can be disposed on a back surface of the display panel.

Referring to FIG. 1, the display device 100 according to an embodiment can be divided into a first curvature area CA1 and a second curvature area CA2.

The first curvature area CA1 can be defined as an area having a radius of curvature equal to or smaller than a reference radius of curvature. Moreover, the second curvature area CA2 can be defined as an area having a radius of curvature greater than the reference radius of curvature or can be defined as a flat area having no curvature. In one example, the reference radius of curvature can be set as a threshold value at which a lifting or dent phenomenon occurs due to the curvature when the cushion plate is attached to the back surface of the display panel.

Further, the display device 100 can further include a source driver (not shown) that provides a source signal corresponding to image data to the display panel, a timing controller (not shown) that provides the image data received from a host system to the source driver, and the like.

Figure 2:
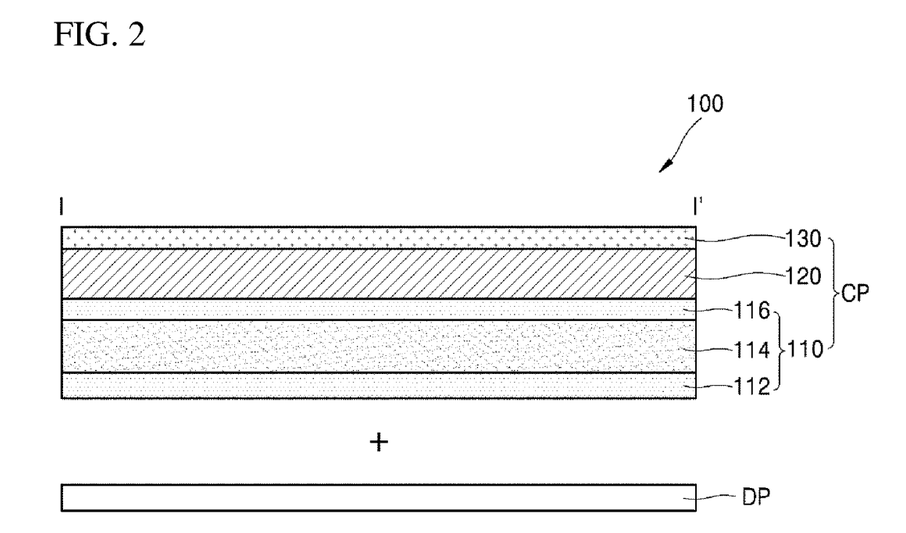
FIGS. 2 to 5 are cross-sectional views taken along a cutting line I-I' shown in FIG. 1, and are partial cross-sectional views of a cushion plate according to first to fourth embodiments, respectively.

FIG. 2 is a cross-sectional view taken along a cutting line I-I' shown in FIG. 1, and is a partial cross-sectional view of a cushion plate CP and the display device 100 including the same according to a first embodiment.

Referring to FIG. 2, the display device 100 according to the first embodiment includes a display panel DP and the cushion plate CP.

The display panel DP includes a display area for displaying the image on a front face thereof. In one example, a plurality of sub-pixels (not shown), a plurality of data lines (not shown), a plurality of gate lines (not shown), and the like can be arranged in the display area.

The cushion plate CP is disposed on a back surface of the display panel DP, and includes an impact-absorbing layer 110, a first metal layer 120, and a protective film 130.

First, the impact-absorbing layer 110 includes a first adhesive layer 112, a foam layer 114, and a second adhesive layer 116.

The first adhesive layer 112 is disposed between the back surface of the display panel DP and the foam layer 114 to adhere the foam layer 114 to the back surface of the display panel DP.

The foam layer 114 is disposed between the first adhesive layer 112 and the second adhesive layer 116. In one example, the foam layer 114, which is a foam having a plurality of bubbles therein, can be made of a urethane foam.

The second adhesive layer 116 is disposed between the foam layer 114 and the first metal layer 120 to adhere the first metal layer 120 to the foam layer 114.

The first metal layer 120 is disposed between the second adhesive layer 116 and the protective film 130. In one example, the first metal layer 120 can be made of stainless steel having a strength equal to or greater than a reference strength. The reference strength can be exemplified as a value at which the display panel DP can be protected from an external physical impact.

In one example, the first adhesive layer 112 can have a thickness greater than that of the second adhesive layer 116, and the first metal layer 120 can have a thickness greater than that of the foam layer 114.

The protective film 130 is disposed on the first metal layer 120. The protective film 130 can be used to protect the display panel DP from cracks, scratches, dust, and the like.

The cushion plate CP and the display device 100 including the same according to the first embodiment can include the impact-absorbing layer 110 in which a number of bubbles are formed and the first metal layer 120 with the great strength to improve the rigidity performance of protecting the display panel DP from the external physical impact.

Figure 3:
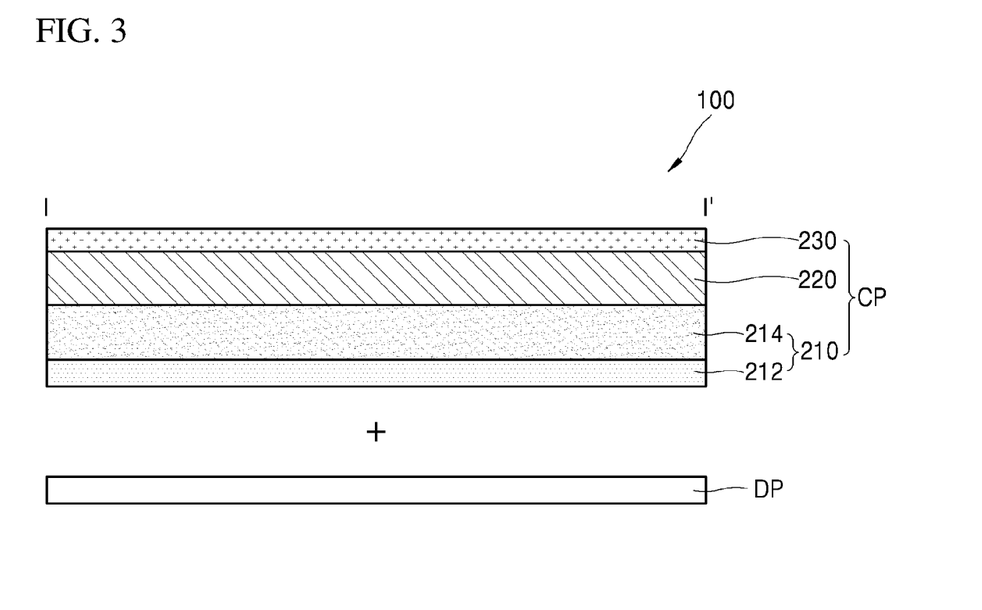

FIG. 3 is a cross-sectional view taken along the cutting line I-I' shown in FIG. 1, and is a partial cross-sectional view of the cushion plate CP and the display device 100 including the same according to a second embodiment.

Referring to FIG. 3, the display device 100 according to the second embodiment includes the display panel DP and the cushion plate CP. Hereinafter, a description of the same component, for example, the description of the display panel DP and the protective film 230 will be replaced with the description of FIG. 2.

The cushion plate CP includes an impact-absorbing layer 210, a second metal layer 220, and a protective film 230.

The impact-absorbing layer 210 includes an adhesive layer 212 and a foam layer 214. The adhesive layer 212 is disposed between the back surface of the display panel DP and the foam layer 114 to adhere the foam layer 214 to the back surface of the display panel DP.

The foam layer 214 is disposed between the adhesive layer 212 and the second metal layer 220. In one example, the foam layer 214, which is a foam having a plurality of bubbles therein, can be made of polyurethane foam.

The second metal layer 220 is disposed between the foam layer 214 and the protective film 230. In one example, the second metal layer 220 can be made of copper having high thermal conductivity and can have a thickness greater than that of the foam layer 214.

The cushion plate CP and the display device 100 including the same according to the second embodiment can include the second metal layer 220 having high thermal conductivity to improve the heat-dissipation performance of dissipating the heat generated from the display panel.

Figure 4:
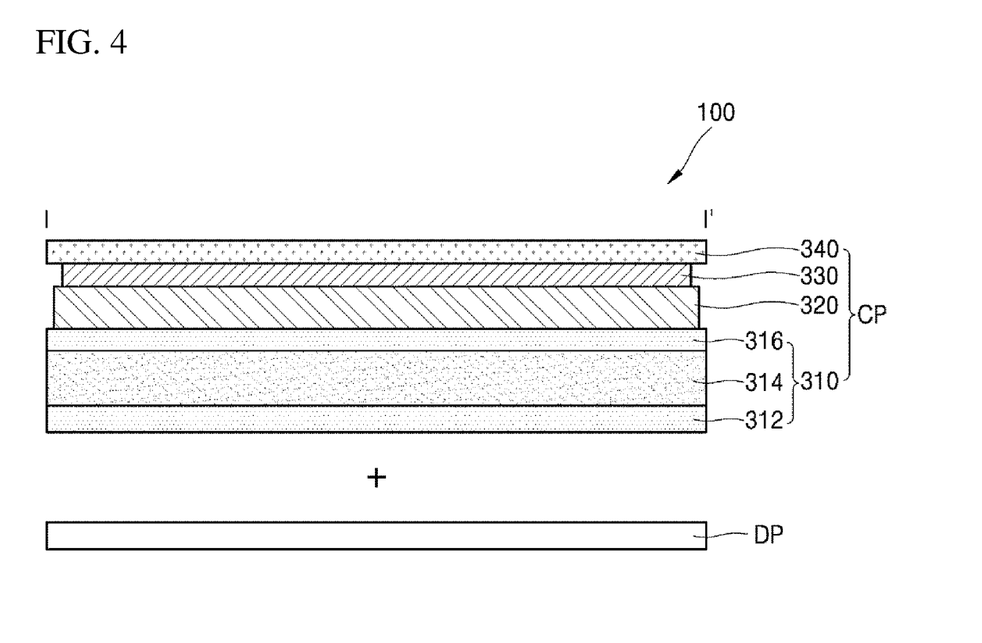

FIG. 4 is a cross-sectional view taken along the cutting line I-I' shown in FIG. 1, and is a partial cross-sectional view of the cushion plate CP and the display device 100 including the same according to a third embodiment.

Referring to FIG. 4, the display device 100 according to the third embodiment includes the display panel DP and the cushion plate CP.

The cushion plate CP is disposed on the back surface of the display panel DP, and includes an impact-absorbing layer 310, a first metal layer 320, a second metal layer 330, and a protective film 340.

The impact-absorbing layer 310 includes a first adhesive layer 312, a foam layer 314, and a second adhesive layer 316. The first adhesive layer 312 is disposed between the back surface of the display panel DP and the foam layer 314 to adhere the foam layer 314 to the back surface of the display panel DP.

The foam layer 314 can be disposed between the first adhesive layer 312 and the second adhesive layer 316 and can have a plurality of bubbles formed therein. The second adhesive layer 316 is disposed between the foam layer 314 and the first metal layer 320 to adhere the first metal layer 320 to the foam layer 314.

The first metal layer 320 is disposed between the second adhesive layer 316 and the second metal layer 330, and the second metal layer 330 is disposed between the first metal layer 320 and the protective film 340.

The first metal layer 320 has a greater strength than the second metal layer 330, and the second metal layer 330 has a higher thermal conductivity than the first metal layer 320. In one example, the first metal layer 320 can be formed of stainless steel and the second metal layer 330 can be made of copper.

The first metal layer 320 can have a smaller thickness than the foam layer 314. Moreover, the first metal layer 320 can have a greater thickness than the second metal layer 330.

Because stainless steel is applied to the first metal layer 320, an increase in rigidity and protection from damage to a back surface can be possible. The second metal layer 330 is an area where a M-FPCB or a set of the display device 100 is grounded. Therefore, resistance management is important for the second metal layer 330, and the second metal layer 330 is effective for heat-dissipation when the copper is applied thereto compared to a case in which the stainless steel is applied thereto.

Moreover, the first metal layer 320 can be formed to have a smaller width than the impact-absorbing layer 310, and the second metal layer 330 can be formed to have a smaller width than the first metal layer 320. As there is a difference in the width between the impact-absorbing layer 310, the first metal layer 320, and the second metal layer 330 as such, it is possible to prevent damage to the display panel DP resulting from tolerance when attaching the cushion plate CP to the display panel DP.

The cushion plate CP and the display device 100 including the same according to the third embodiment can include the impact-absorbing layer 310 including the foam layer 314, the first metal layer 320 with the great strength, and the second metal layer 330 with high thermal conductivity to improve rigidity performance and heat-dissipation performance.

Figure 5:
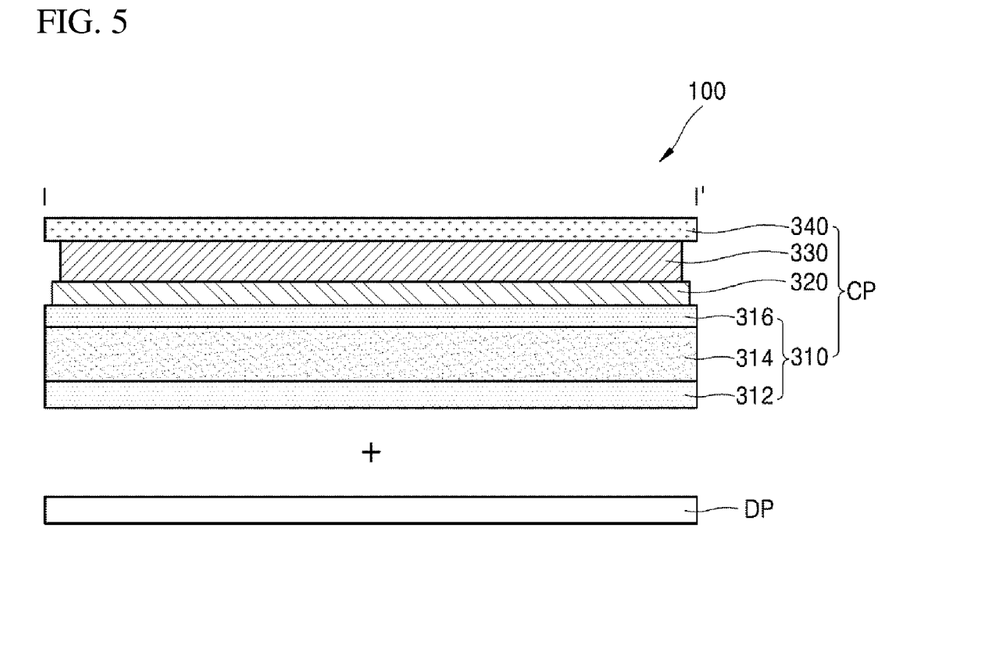

FIG. 5 is a cross-sectional view taken along the cutting line I-f shown in FIG. 1, and is a partial cross-sectional view of the cushion plate CP and the display device 100 including the same according to a fourth embodiment.

Referring to FIG. 5, the display device 100 according to the fourth embodiment includes the display panel DP and the cushion plate CP.

The cushion plate CP is disposed on the back surface of the display panel DP, and includes an impact-absorbing layer 310, a first metal layer 320, a second metal layer 330, and a protective film 340. A description of the impact-absorbing layer 310 will be replaced with the description of FIG. 4.

The first metal layer 320 is disposed between a second adhesive layer 316 and the second metal layer 330, and the second metal layer 330 is disposed between the first metal layer 320 and the protective film 340. In one example, the first metal layer 320 can be made of stainless steel having a greater strength than a material of the second metal layer 330, and the second metal layer 330 can be made of copper having a higher thermal conductivity than the material of the first metal layer 320.

In the fourth embodiment, the second metal layer 330 can have a greater thickness than the first metal layer 320. The fourth embodiment can be applied to the display device 100 requiring high heat-dissipation performance because the thickness of the second metal layer 330 having high thermal conductivity is greater than that of the first metal layer 320 having high rigidity.

In the cushion plate CP, the thicknesses of the first metal layer 320 and the second metal layer 330 can change based on the performance required in the display device 100. For example, the cushion plate CP of the display device 100, which requires rigidity performance more compared to heat-dissipation performance, can be designed such that the first metal layer 320, which has great strength, has a thickness greater than that of the second metal layer 330. Moreover, the cushion plate CP of the display device 100, which requires heat-dissipation performance more compared to the rigidity performance, can be designed such that the second metal layer 330 having high thermal conductivity has a thickness greater than that of the first metal layer 320.

As described above, the thicknesses of the foam layer 314, the first metal layer 320, and the second metal layer 330 can change based on the required performance of the display device 100 and an electronic device to which the display device 100 is applied.

The cushion plate CP and the display device 100 including the same according to the fourth embodiment can include the impact-absorbing layer 310 including foam layer 314, the first metal layer 320 with great strength, and the second metal layer 330, which has high thermal conductivity and has thickness greater than that of the first metal layer 320 to improve rigidity performance and heat-dissipation performance.

Figure 6:
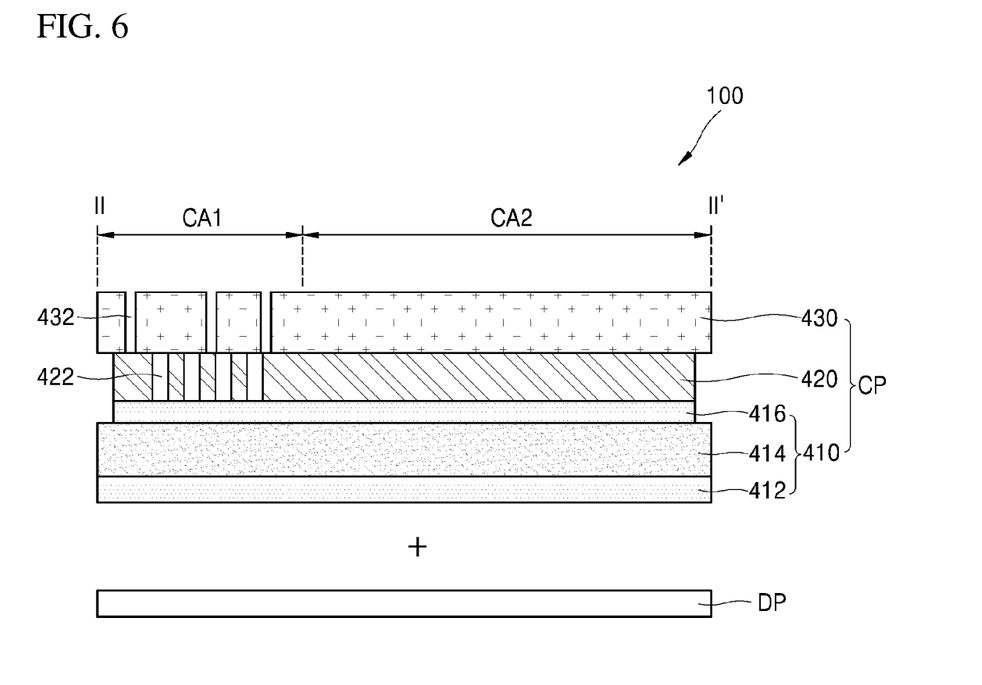
FIGS. 6 to 9 are cross-sectional views taken along a cutting line II-II' shown in FIG. 1, and are partial cross-sectional views of a display module according to fifth to eighth embodiments, respectively.

FIG. 6 is a cross-sectional view taken along a cutting line II-IP shown in FIG. 1, and is a partial cross-sectional view of the cushion plate CP and the display device 100 including the same according to a fifth embodiment.

Referring to FIG. 6, the display device 100 according to the fifth embodiment includes the display panel DP and the cushion plate CP.

The display device 100 can include the first curvature area CA1, which has the radius of curvature equal to or smaller than the reference radius of curvature, and the second curvature area CA2, which has the radius of curvature greater than the reference radius of curvature. As another example, the second curvature area CA2 can be exemplified as the flat area without the curvature. In this regard, the reference radius of curvature can be set as the threshold value at which the lifting or dent phenomenon occurs at a specific curvature when the cushion plate is attached to the back surface of the display panel DP.

The display panel DP includes the display area for displaying the image on the front face thereof, and the cushion plate CP is attached to the back surface of the display panel DP.

The cushion plate CP includes an impact-absorbing layer 410, a first metal layer 420, and a protective film 440. The impact-absorbing layer 410, the first metal layer 420, and the protective film 430 have the first curvature area CA1 and the second curvature area CA2.

The impact-absorbing layer 410 includes a first adhesive layer 412, a foam layer 414, and a second adhesive layer 416. The first adhesive layer 412 is disposed between the back surface of the display panel DP and the foam layer 414 and adheres the foam layer 414 to the back surface of the display panel DP.

The foam layer 414 is disposed between the first adhesive layer 412 and the second adhesive layer 416. The foam layer 414, which is a foam in which a plurality of bubbles are formed, can have a certain elastic modulus. In one example, the foam layer 414 can be made of polyurethane foam obtained by foaming a polyurethane resin.

The second adhesive layer 416 is disposed between the foam layer 414 and the first metal layer 420 and adheres the first metal layer 420 to the foam layer 414.

The first metal layer 420 is disposed between the second adhesive layer 416 and the protective film 430. The first metal layer 420 can be made of a material having a great strength. In one example, the first metal layer 420 can be made of stainless steel.

In such first metal layer 420, at least one first perforated pattern 422 is defined or disposed in the first curvature area CAL In one example, the first perforated pattern 422 can be defined or disposed in a thickness direction of the first metal layer 420. In another example, the first perforated pattern 422 can be defined or disposed in a width direction of the first metal layer 420. In another example, the first perforated pattern 422 can be formed in a diagonal direction. Such first perforated pattern 422 prevents the lifting or dent phenomenon occurring in the first curvature area CA1 when attaching the cushion plate CP.

The first metal layer 420 has a smaller width than the impact-absorbing layer 410.

Because stainless steel is applied to the first metal layer 420, the cushion plate CP can increase in the rigidity and can protect the display panel DP from damage to the back surface thereof.

The protective film 430 is formed on the first metal layer 420. At least one second perforated pattern 432 is defined or disposed in an area of the protective film 430 corresponding to the first curvature area CAL In one example, the second perforated pattern 432 can be defined or disposed in a thickness direction of the protective film 430.

Such cushion plate CP and display device 100 including the same according to the fifth embodiment can improve rigidity performance because the first metal layer 420 having great strength is disposed on the impact-absorbing layer 410.

Further, the cushion plate CP and the display device 100 including the same according to the fifth embodiment can prevent the lifting or dent phenomenon of the cushion plate CP in the first curvature area CA1 because the at least one perforated pattern 422 is defined or disposed in an area of the first metal layer 420 corresponding to the first curvature area CAL Further, the cushion plate CP and the display device 100 including the same according to the fifth embodiment can maintain rigidity performance by the first metal layer 420 because the lifting or dent phenomenon of the cushion plate CP is prevented in the first curvature area CA1.

Figure 7:
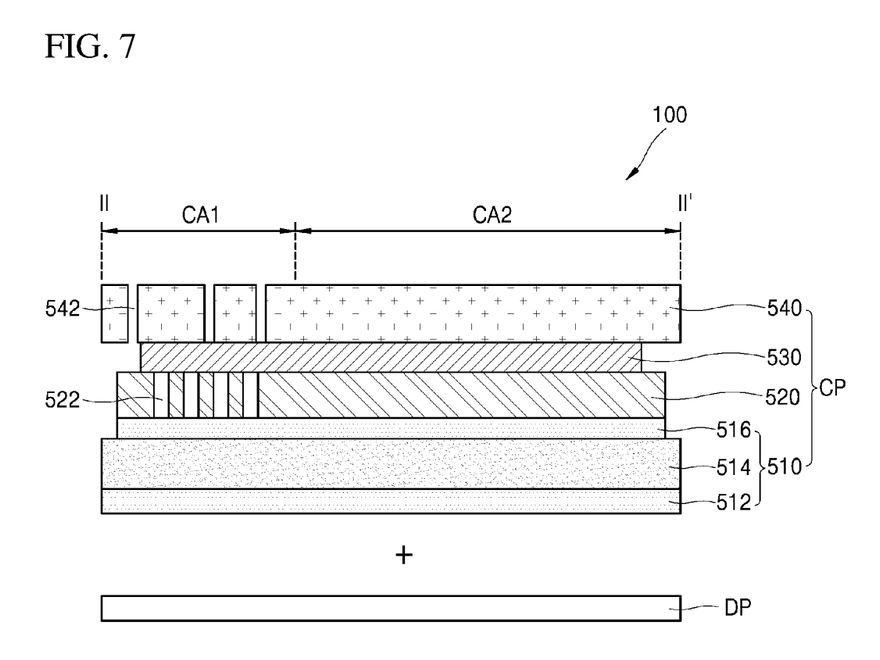

FIG. 7 is a cross-sectional view taken along the cutting line II-IP shown in FIG. 1, and is a partial cross-sectional view of the cushion plate CP and the display device 100 including the same according to a sixth embodiment.

Referring to FIG. 7, the display device 100 according to the sixth embodiment includes the display panel DP and the cushion plate CP.

The display device 100 can be divided into the first curvature area CA1 and the second curvature area CA2. The first curvature area CA1 can be exemplified as the area having the value equal to or smaller than the reference radius of curvature, and the second curvature area CA2 can be exemplified as the area having the value greater than the reference radius of curvature or the flat area having no curvature.

The display panel DP includes the display area for displaying the image on the front face thereof, and the cushion plate CP is attached to the back surface of the display panel DP.

The cushion plate CP includes an impact-absorbing layer 510, a first metal layer 520, a second metal layer 530, and a protective film 540. The impact-absorbing layer 510, the first metal layer 520, the second metal layer 530, and the protective film 540 have the first curvature area CA1 and the second curvature area CA2.

The impact-absorbing layer 510 includes a first adhesive layer 512, a foam layer 514, and a second adhesive layer 516. The first adhesive layer 512 is disposed between the back surface of the display panel DP and the foam layer 514 and adheres the foam layer 514 to the back surface of the display panel DP.

The foam layer 514 is disposed between the first adhesive layer 512 and the second adhesive layer 516. The foam layer 514 can have a plurality of bubbles formed therein and can have a certain elastic modulus. In one example, the foam layer 514 can be made of the polyurethane foam obtained by foaming the polyurethane resin.

The second adhesive layer 516 is disposed between the foam layer 514 and the first metal layer 520 and adheres the first metal layer 520 to a top face of the foam layer 514.

The first metal layer 520 is disposed between the second adhesive layer 516 and the second metal layer 530. The first metal layer 520 can be made of a material having a greater strength than a material of the second metal layer 530. In one example, the first metal layer 520 can be made of the stainless steel.

In the first metal layer 520, at least one first perforated pattern 522 is defined or disposed in the first curvature area CA1. In one example, the first perforated pattern 522 can be defined or disposed in a thickness direction of the first metal layer 520. In another example, the first perforated pattern 522 can be defined or disposed in a width direction of the first metal layer 520. In another example, the first perforated pattern 522 can be formed in a diagonal direction. Such first perforated pattern 522 can prevent the lifting or dent phenomenon occurring in the first curvature area CA1 when attaching the cushion plate CP to the back surface of the display panel DP.

The second metal layer 530 is disposed between the first metal layer 520 and the protective film 540. The second metal layer 530 can be made of a material having a higher thermal conductivity than the material of the first metal layer 520. In one example, the second metal layer 530 can be made of copper.

The cushion plate CP can increase in rigidity and can protect the display panel DP from the damage to the back surface thereof by applying the stainless steel to the first metal layer 520, and can improve heat-dissipation performance by applying copper to the second metal layer 530. Moreover, the cushion plate CP improves an electrostatic discharge (ESD) performance of discharging static electricity by applying copper to the second metal layer 530. The M-FPCB or the set of the display device 100 can be grounded to the second metal layer 530.

The first metal layer 520 can be formed to have a greater thickness than the second metal layer 530. A thickness relationship between the first metal layer 520 and the second metal layer 530 can change based on the required performance of the display device 100.

For example, the cushion plate CP of the display device 100, which requires rigidity performance more compared to the heat-dissipation performance, can be designed such that the first metal layer 520, which has the great strength, has a thickness greater than that of the second metal layer 530. Moreover, the cushion plate CP of the display device 100, which requires heat-dissipation performance more compared to the rigidity performance, can be designed such that the second metal layer 530 having high thermal conductivity has a thickness greater than that of the first metal layer 520. Moreover, in the display device 100 requiring a small thickness, the first metal layer 520 and the second metal layer 530 can be designed to have minimum thicknesses available in a process.

As described above, the thicknesses of the foam layer 514, the first metal layer 520, and the second metal layer 530 and a thickness relationship therebetween can change based on the required performance of the display device 100 and the electronic device employing the same.

The first metal layer 520 can be formed to have a smaller width than the impact-absorbing layer 510. Moreover, the second metal layer 530 can be formed to have a smaller width than the first metal layer 520. As there is a difference in the width between the impact-absorbing layer 510, the first metal layer 520, and the second metal layer 530, and as such, the cushion plate CP can prevent the display panel CP from being damaged.

The protective film 540 is formed on the second metal layer 530. At least one second perforated pattern 542 is defined or disposed in an area of the protective film 540 corresponding to the first curvature area CAL In one example, the second perforated pattern 542 can be defined or disposed in a thickness direction of the protective film 540.

Such cushion plate CP and display device 100 including the same according to the sixth embodiment can improve rigidity performance because the first metal layer 520 having the great strength is disposed on the impact-absorbing layer 510.

Further, the cushion plate CP and the display device 100 including the same according to the sixth embodiment can improve the heat-dissipation performance as the second metal layer 530 with high thermal conductivity is disposed on the first metal layer 520.

Further, the cushion plate CP and the display device 100 including the same according to the sixth embodiment can prevent the lifting or dent phenomenon of the cushion plate CP in the first curvature area CA1 because the at least one perforated pattern 522 is defined or disposed in an area of the first metal layer 520 corresponding to the first curvature area CA1.

Further, the cushion plate CP and the display device 100 including the same according to the sixth embodiment can include the first metal layer 520 having great strength and the second metal layer 530 having high thermal conductivity to improve rigidity and heat-dissipation performance.

Further, the cushion plate CP and the display device 100 including the same according to the sixth embodiment can provide driving stability and slow deterioration speed of a lifespan because the heat-dissipation performance is improved.

Further, the cushion plate CP and the display device 100 including the same according to the sixth embodiment can protect the display panel DP from the external physical impact because the rigidity performance is improved.

Figure 8:
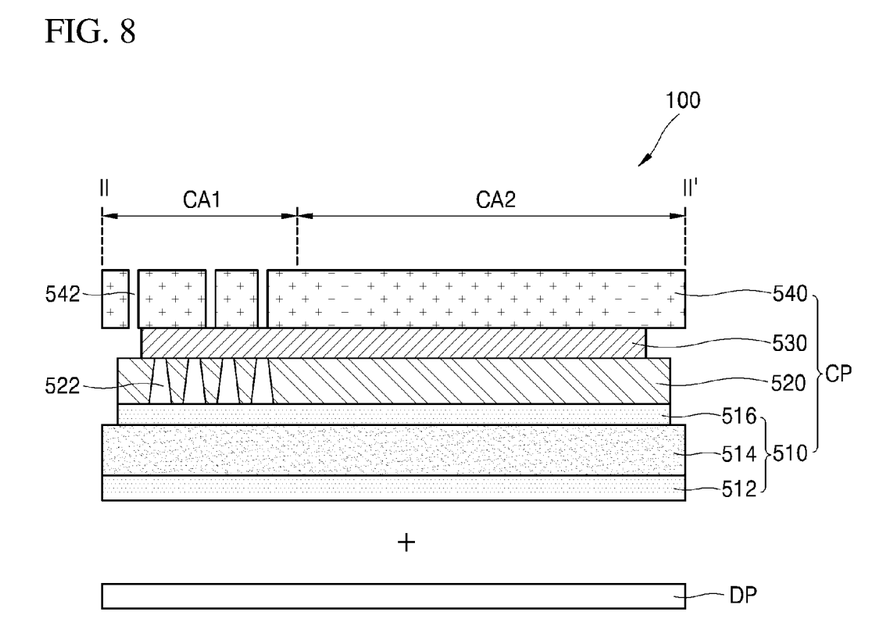

FIG. 8 is a cross-sectional view taken along the cutting line II-IP shown in FIG. 1, and is a partial cross-sectional view of the cushion plate CP and the display device 100 including the same according to a seventh embodiment.

Referring to FIG. 8, the display device 100 according to the seventh embodiment includes the display panel DP and the cushion plate CP. In the description of FIG. 8, the description of the same components will be replaced with the description of FIG. 7.

The first metal layer 520 can be made of a material having greater strength than a material of the second metal layer 530, and can be, for example, made of stainless steel. Moreover, in the first curvature area CA1 of the first metal layer 520, the at least one first perforated pattern 522 is defined or disposed in the thickness direction of the first metal layer 520.

In one example, the first perforated pattern 522 can have a width that gradually decreases in an upward direction. For example, the width of the first perforated pattern 522 can be large at a position facing the back surface of the display panel DP in the first curvature area CA1 and the width can decrease in the upward direction.

In another example, when the cushion plate CP is attached to the back surface of the display panel DP, a width of a lower portion where a compressive strength occurs by a curvature can be greater than that of an upper portion, and the width of the upper portion where a tensile strength occurs can be smaller than the lower portion. The lifting or dent phenomenon occurring in the first curvature area CA1 can be prevented by the at least one first perforated pattern 522.

The second metal layer 530 can be made of material having higher thermal conductivity than the first metal layer 520, and can be, for example, made of copper.

The protective film 540 is formed on the second metal layer 530. The at least one second perforated pattern 542 is defined or disposed in the area of the protective film 540 corresponding to the first curvature area CA1.

In one example, the second perforated pattern 542 can be defined or disposed in the thickness direction of the protective film 540. In another example, the second perforated pattern 542 can be defined or disposed in the same shape as the first perforated pattern 522 defined or disposed in the first metal layer 520. For example, the second perforated pattern 542 can be formed in a shape in which a width thereof gradually decreases in the upward direction.

Such cushion plate CP and display device 100 including the same according to the seventh embodiment can improve the rigidity performance because the first metal layer 520 having the great strength is disposed on the impact-absorbing layer 510.

Further, the cushion plate CP and the display device 100 including the same according to the seventh embodiment can improve the heat-dissipation performance as the second metal layer 530 with high thermal conductivity is disposed on the first metal layer 520.

Further, the cushion plate CP and the display device 100 including the same according to the seventh embodiment can prevent the lifting or dent phenomenon of the cushion plate CP in the first curvature area CA1 because the at least one perforated pattern 522 is defined or disposed in the area of the first metal layer 520 corresponding to the first curvature area CA1.

Further, the cushion plate CP and the display device 100 including the same according to the seventh embodiment can include the first metal layer 520 having the great strength and the second metal layer 530 having high thermal conductivity to improve the rigidity and the heat-dissipation performance.

Further, the cushion plate CP and the display device 100 including the same according to the seventh embodiment can provide the driving stability and slow the deterioration speed of the lifespan because the heat-dissipation performance is improved.

Further, the cushion plate CP and the display device 100 including the same according to the seventh embodiment can protect the display panel DP from the external physical impact because the rigidity performance is improved.

Figure 9:
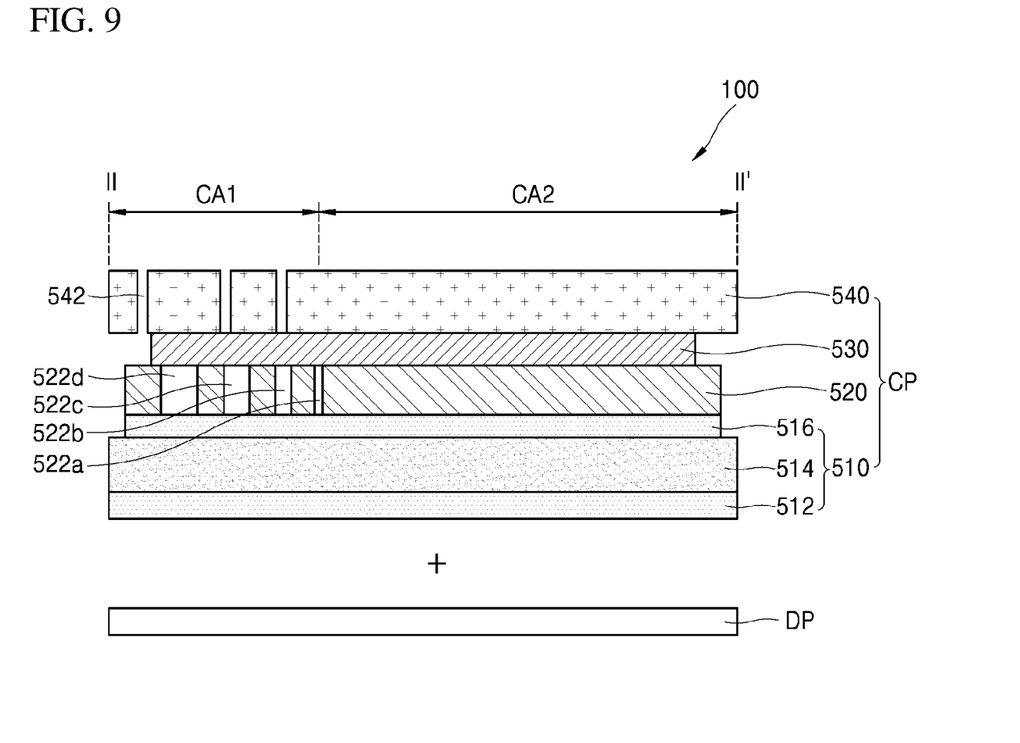

FIG. 9 is a cross-sectional view taken along the cutting line II-IP shown in FIG. 1, and is a partial cross-sectional view of the cushion plate CP and the display device 100 including the same according to an eighth embodiment.

Referring to FIG. 9, the display device 100 according to the eighth embodiment includes the display panel DP and the cushion plate CP. In the description of FIG. 9, the description of the same components will be replaced with the description of FIGS. 7 and 8.

The first metal layer 520 can be made of material having higher strength than the material of the second metal layer 530, and can be, for example, made of stainless steel. Moreover, a third perforated pattern 522a is defined or disposed in the thickness direction of the first metal layer 520 in the first curvature area CA1 of the first metal layer 520, and fourth perforated patterns 522b, 522c, and 522d having widths greater than a width of the third perforated pattern 522a are defined or disposed side by side on a side of the third perforated pattern 522a.

For example, the third perforated pattern 522a is defined or disposed at one side of the first metal layer 520 corresponding to the first curvature area CA1, and the fourth perforated patterns 522b, 522c, and 522d are defined or disposed side by side at regular spacings in the lateral direction at one side. In one example, the fourth perforated patterns 522b, 522c, and 522d can be defined or disposed such that the widths thereof gradually increase in the lateral direction.

The advantage of the cushion plate CP and the display device 100 including the same according to the eighth embodiment will be replaced with the description of FIGS. 7 and 8.

The cushion plate CP according to the first embodiment includes the impact-absorbing layer 110 disposed on the back surface of the display panel DP, the first metal layer 120 disposed on the impact-absorbing layer 110 and having the strength equal to or greater than the reference strength, and the protective film 130 formed on the first metal layer 120.

The cushion plate CP according to the second embodiment includes the impact-absorbing layer 210 disposed on the back surface of the display panel DP, the second metal layer 220 disposed on the impact-absorbing layer 210 and having high thermal conductivity, and the protective film 230 formed on the second metal layer 220.

The cushion plate CP according to the third embodiment includes the impact-absorbing layer 310 disposed on the back surface of the display panel DP, the first metal layer 320 disposed on the impact-absorbing layer 310 and having great strength, the second metal layer 330 disposed on the first metal layer 320 and having high thermal conductivity, and the protective film 340 formed on the second metal layer 330.

In the fourth embodiment, the second metal layer 330 has the greater thickness than the first metal layer 320.

The cushion plate CP according to the fifth embodiment includes the impact-absorbing layer 410 disposed on the back surface of the display panel DP, the first metal layer 420 disposed on the impact-absorbing layer 410 and having great strength, and the protective film 430 formed on the first metal layer 420. The impact-absorbing layer 410 and the first metal layer 420 have the first curvature area CA1, and the at least one perforated pattern 422 is defined or disposed in the area of the first metal layer 420 corresponding to the first curvature area CA1.

The cushion plate CP according to the sixth embodiment includes the impact-absorbing layer 510 disposed on the back surface of the display panel DP, the first metal layer 520 disposed on the impact-absorbing layer 510 and having great strength, and the first metal layer 530 formed on the first metal layer 520. The impact-absorbing layer 510, the first metal layer 520, and the second metal layer 530 have the first curvature area CA1, and the at least one perforated pattern 522 is defined or disposed in the area of the first metal layer 520 corresponding to the first curvature area CA1.

In the sixth embodiment, the at least one perforated pattern 522 is defined or disposed in the thickness direction of the first metal layer 520.

In the sixth embodiment, the first metal layer 520 has greater strength than the second metal layer 530.

In the sixth embodiment, the first metal layer 520 has greater thickness than the second metal layer 530.

In the sixth embodiment, the second metal layer 530 has greater thickness than the first metal layer 520.

In the sixth embodiment, the impact-absorbing layer 510 includes the first adhesive layer 512 adhered to the back surface of the display panel DP, the foam layer 514 disposed on the first adhesive layer 512 and having a number of bubbles formed therein, and the second adhesive layer 516 disposed between the foam layer 514 and the first metal layer 520.

In the sixth embodiment, the first metal layer 520 has smaller width than the impact-absorbing layer 510.

In the sixth embodiment, the second metal layer 530 has smaller width than the first metal layer 520.

In the sixth embodiment, the impact-absorbing layer 510, the first metal layer 520, and the second metal layer 9530 are divided into the first curvature area CA1 having the radius of curvature smaller than the reference radius of curvature and the second curvature area CA2 having the radius of curvature greater than the reference radius of curvature.

In the sixth embodiment, the protective film 540 formed on the second metal layer 530 is further included, and the at least one second perforated pattern 542 is defined or disposed in the area of the protective film 540 corresponding to the first curvature area CAL In the seventh embodiment, the at least one perforated pattern 522 is defined or disposed in the thickness direction of the first metal layer 520 and has the width that decreases in the upward direction.

In the eighth embodiment, the third perforated pattern 522*a* is defined or disposed in the thickness direction of the first metal layer CA1 in the first curvature area CA1 of the first metal layer 520, and the fourth perforated patterns 522*b*, 522*c*, and 522*d* having the widths greater than that of the third perforated pattern 522*a* are defined or disposed side by side in the lateral direction from the third perforated pattern 522*a*.

The scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A cushion plate comprising:
   an impact-absorbing layer disposed on a display panel;
   a first metal layer disposed on the impact-absorbing layer; and
   a second metal layer disposed on the first metal layer and having higher thermal conductivity than the first metal layer,
   wherein the impact-absorbing layer, the first metal layer, and the second metal layer have a first curvature area, and
   wherein at least one perforated pattern is disposed in an area of the first metal layer corresponding to the first curvature area.

2. The cushion plate of claim 1, wherein the at least one perforated pattern is disposed in a thickness direction of the first metal layer.

3. The cushion plate of claim 1, wherein the first metal layer has greater strength than the second metal layer.

4. The cushion plate of claim 3, wherein the first metal layer has greater thickness than the second metal layer.

5. The cushion plate of claim 3, wherein the second metal layer has greater thickness than the first metal layer.

6. The cushion plate of claim 1, wherein the impact-absorbing layer includes:
   a first adhesive layer adhered to the display panel;
   a foam layer disposed on the first adhesive layer and having a plurality of bubbles formed therein; and
   a second adhesive layer disposed between the foam layer and the first metal layer.

7. The cushion plate of claim 1, wherein the first metal layer has a smaller width than the impact-absorbing layer.

8. The cushion plate of claim 7, wherein the second metal layer has a smaller width than the first metal layer.

9. The cushion plate of claim 1, wherein the impact-absorbing layer, the first metal layer, and the second metal layer are divided into the first curvature area having a radius of curvature smaller than a reference radius of curvature and a second curvature area having a radius of curvature greater than the reference radius of curvature.

10. The cushion plate of claim 1, wherein the at least one perforated pattern is disposed in a thickness direction of the first metal layer and has a width decreasing in an upward direction.

11. The cushion plate of claim 1, wherein a third perforated pattern is disposed in a thickness direction of the first metal layer in the first curvature area of the first metal layer, and fourth perforated patterns having widths greater than a width of the third perforated pattern are disposed side by side in a lateral direction of the third perforated pattern.

12. The cushion plate of claim 1, further comprising a protective film disposed on the second metal layer,
    wherein at least one second perforated pattern is disposed in an area of the protective film corresponding to the first curvature area.

13. A display device comprising:
    a display panel; and
    a cushion plate disposed on a back surface of the display panel,
    wherein the cushion plate includes:
      an impact-absorbing layer disposed on the back surface of the display panel;
      a first metal layer disposed on the impact-absorbing layer; and
      a second metal layer disposed on the first metal layer and having higher thermal conductivity than the first metal layer,
    wherein the impact-absorbing layer, the first metal layer, and the second metal layer have a first curvature area,
    wherein at least one perforated pattern is disposed in an area of the first metal layer corresponding to the first curvature area.

14. The display device of claim 13, wherein the at least one perforated pattern is disposed in a thickness direction of the first metal layer.

15. The display device of claim 13, wherein the first metal layer has greater strength and greater thickness than the second metal layer.

16. The display device of claim 13, wherein the impact-absorbing layer includes:
    a first adhesive layer adhered to the back surface of the display panel;
    a foam layer disposed on the first adhesive layer and having a plurality of bubbles disposed therein; and
    a second adhesive layer disposed between the foam layer and the first metal layer.

17. A display device comprising:
    a display panel including a first curvature area and a second curvature area, wherein the first curvature area has a radius of curvature equal to or smaller than a reference radius of curvature and the second curvature area has a radius of curvature greater than the reference radius of curvature; and
    a cushion plate disposed on a back surface of the display panel,
    wherein the cushion plate includes:
      an impact-absorbing layer disposed on the back surface of the display panel;
      a first metal layer disposed on the impact-absorbing layer and having a strength greater than a reference strength; and
      a second metal layer disposed on the first metal layer and having smaller strength and higher thermal conductivity than the first metal layer, wherein at least one perforated pattern is disposed in an area of the first metal layer corresponding to the first curvature area.

18. The display device of claim 17, wherein the at least one perforated pattern is disposed in a thickness direction of the first metal layer.

19. The display device of claim 18, wherein the at least one perforated pattern has a width decreasing in an upward direction from the back surface of the display panel.

20. The display device of claim 17, wherein a third perforated pattern is disposed in a thickness direction of the first metal layer in the first curvature area of the first metal layer, and fourth perforated patterns having widths greater than a width of the third perforated pattern are disposed side by side in a lateral direction of the third perforated pattern.

* * * * *